(12) United States Patent
Huang et al.

(10) Patent No.: US 7,182,607 B2
(45) Date of Patent: Feb. 27, 2007

(54) LGA SOCKET CONNECTOR HAVING GUIDING MEANS

(75) Inventors: Chieh-Jung Huang, Tu-Cheng (TW); Ming-Lun Szu, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/273,648

(22) Filed: Nov. 14, 2005

(65) Prior Publication Data

US 2006/0105609 A1 May 18, 2006

(30) Foreign Application Priority Data

Nov. 12, 2004 (TW) .............................. 93218114 U

(51) Int. Cl.
*H01R 12/00* (2006.01)
(52) U.S. Cl. .......................................... 439/71; 439/66
(58) Field of Classification Search ................ 439/71, 439/73, 66, 331, 677
See application file for complete search history.

(56) References Cited

U.S. PATENT DOCUMENTS 5,273,448 A * 12/1993 Myer et al. ................. 439/188
5,342,205 A * 8/1994 Hashiguchi .................. 439/66
5,358,411 A * 10/1994 Mroczkowski et al. ........ 439/66
6,565,364 B1 * 5/2003 Yun ............................. 439/71
6,758,683 B2 * 7/2004 Koopman et al. ............ 439/71
6,827,586 B2 * 12/2004 Noda et al. .................. 439/71
6,905,377 B2 * 6/2005 Murr ........................... 439/862
6,957,964 B2 * 10/2005 Chiang ......................... 439/66

* cited by examiner

*Primary Examiner*—Michael C. Zarroli
(74) *Attorney, Agent, or Firm*—Wei Te Chung

(57) ABSTRACT

Disclosed is an electrical socket connector including an insulative housing (1) with a plurality of passageways (101) extending from a top mating interface (10a) toward a mounting interface (10b). A plurality of terminals (2) is inserted into the respective passageways from the mating interface to the mounting interface. Each of the terminals includes a main body (20), a lower contact engaging portion (21) extending downwardly from the main body. Guiding means (102) are formed between the terminal and the passageway and adjacent the contact engaging portion such that during the insertion of the terminal into the passageway, said guiding means and the terminal begin to mate at a location that the contact engaging portion of the terminal does not enter the passageway.

17 Claims, 6 Drawing Sheets

LGA SOCKET CONNECTOR HAVING GUIDING MEANS

BACKGROUND OF THE INVENTION

1. Field of the Invention

The present invention relates to an electrical socket connector, and more particularly to an LGA socket connector having guiding means which can effectively prevent terminals from deformation during assembling processes of the terminals.

2. Background of the Invention

The development of the connector industry toward the miniaturized, high-density and more reliable trends has required many connectors, especially LGA sockets, to be arranged in a high-density manner to keep up with the trends. The LGA sockets are the most favorable and user-friendly products for electrical connection of an IC package and a printed circuit board (PCB). Requirement for the LGA sockets to be high-density may often result in electrical connection failure between the IC package and the PCB, in that the important electrical connecting components, i.e. terminals, are prone to be damaged during manufacturing processes of the terminals including the process of inserting the terminals into the passageways.

For example, when the terminal is inserted into the terminal receiving passageway by its mating end or contact engaging portion extending toward the passageway. Crash or collision between the mating end and the passageway frequently occurs before the terminal wholly enters the passageway. That is, because no guiding means formed on the terminal or the connector housing adjacent the passageway to aid in the insertion of the terminal into the passageway.

Some guiding means, such as lead-in edges, have been developed to help the terminal to be readily inserted into the passageway. However, no crash is prevented by these guiding means, because there is possibility that before the lead-in edges act as guiding means for the terminal to be inserted into the passageway, the mating end of the terminal will have been in contact with the passageway including a top surface thereof, thereby resulting in deformation or deflection of the mating end of the terminal. Electrical connection between the LGA package and socket fails due to deformation of the terminal.

SUMMARY OF THE INVENTION

In order to resolve the existing issues encountered by the industry, the inventor provides the following solutions so as to overcome the shortcoming of the existing design. According to one of the preferred embodiments, an electrical connector includes an insulative housing having a general flat base with a top mating interface adapted to face an LGA package, and a mounting interface adapted to face a printed circuit board. The base includes a plurality of passageways extending from the top mating interface toward the mounting interface, with a plurality of terminals respectively inserted into the passageways from the mating interface to the mounting interface. Each of the terminals include a main body, an upward contact engaging portion extending from the passageway and beyond the top mating interface, and a downward contact engaging portion on which a solder ball is attached thereon. Guiding means are formed between the terminal and the passageway and adjacent one of the contact engaging portions of the terminal such that during the insertion of the terminal into the passageway, said guiding means and the terminal begin to mate at a location that the contact engaging portion of the terminal does not enter the passageway.

The provision of said guiding means has the advantage that, the terminal begins to mate with said guiding means before its contact engaging portion of the terminal does enter the passageway. Accordingly, no crash between the contact engaging portion and the passageway will occur, in that once the terminal happens to mate with said guiding means, the terminal is guided by said guiding means to be inserted along a predetermined path of the passageway, there is no possibility of the contact engaging portion in contact with the passageway including the top surface thereof.

Other features and advantages of the present invention will become more apparent to those skilled in the art upon examination of the following drawings and detailed description of preferred embodiments, in which:

DETAILED DESCRIPTION OF PREFERRED EMBODIMENTS

Figure 1:
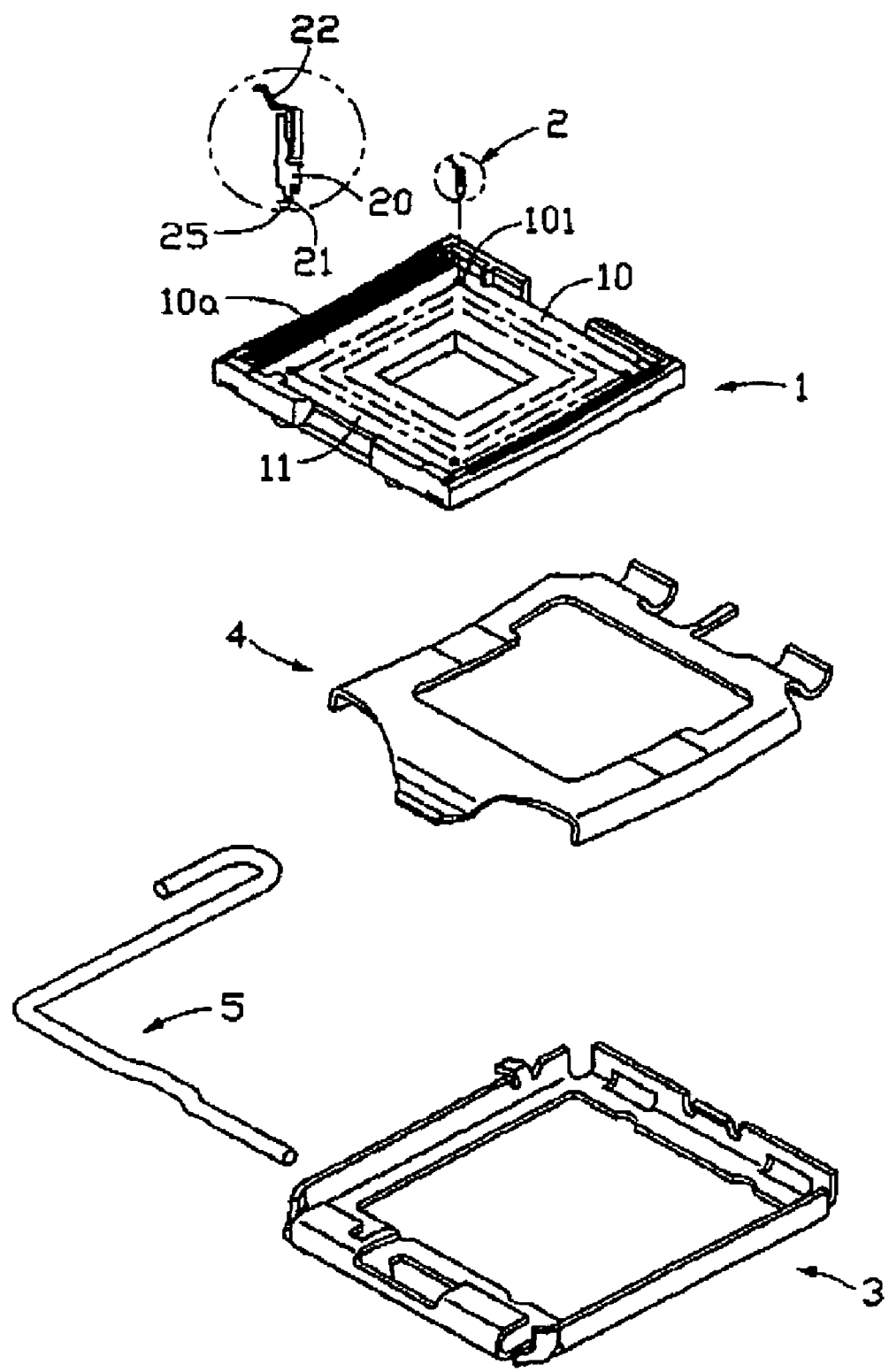
FIG. 1 is a simplified, exploded isometric view of an electrical connector according to a first preferred embodiment of the present invention.

Referring to FIGS. 1 to 4, an electrical socket connector according to the first preferred embodiment includes an insulative housing 1 having a general flat base 10 with a top mating interface 10*a* adapted to face an LGA package (not shown), and a mounting interface 10*b* adapted to face a printed circuit board (not shown). The base 10 includes a plurality of passageways 101 extending from the top mating interface 10*a* toward the mounting interface 10*b*, with a plurality of terminals 2 inserted into the respective passageways 101 from the mating interface 10*a* to the mounting interface 10*b*. After the terminals 2 are assembled into the passageways 101, such a sub-assembly is then disposed onto a metal stiffener 3, which further includes a clip 4 and a lever 5 to jointly press the LGA package onto the base 10 so as to make electrically connection between the LGA package and the electrical socket.

Each of the terminals 2, after assembled, includes a main body 20, an upper contact engaging portion 22 extending upwardly from the main body 20 to be located above the base 10 a lower contact engaging portion or mounting tip 21 extending downwardly from the main body 20 to be below the base 10, and retention portion 23 located between the upper contact engaging portion 22 and the lower mounting tip 21 for retaining the terminal 2 onto. The lower contact engaging portion or lower mounting tip 21 on which a solder ball 25 is attached thereon is adapted to mate with the printed circuit board, while the upper contact engaging portion 22 extends from the passageway 101 and beyond the top mating interface 10a to mate with the LGA package. Interengaging guiding means is formed between the terminal 2 and the passageway 101, and adjacent one of the contact engaging portions 21, 22 of the terminal 2 such that during the insertion of the terminal 2 into the passageway 101, the guiding means and the terminal 2 begin to mate at a location tat the contact engaging portion 21 of the terminal 2 does not enter the passageway 101.

In the first embodiment, the guiding means is preferably a blocking wall 102 formed on the base 10 to abut against the passageway 101. The blocking wall 102 and the terminal 2 have matching lead-in surfaces 1021, 2021 adjacent one side of the terminal 2 and the lower contact engaging portion 21. In addition, the terminal 2 is formed with another lead-in surface 2021 on opposite side thereof, to aid in the insertion of the terminal 2 into the passageway 101.

Figure 2:
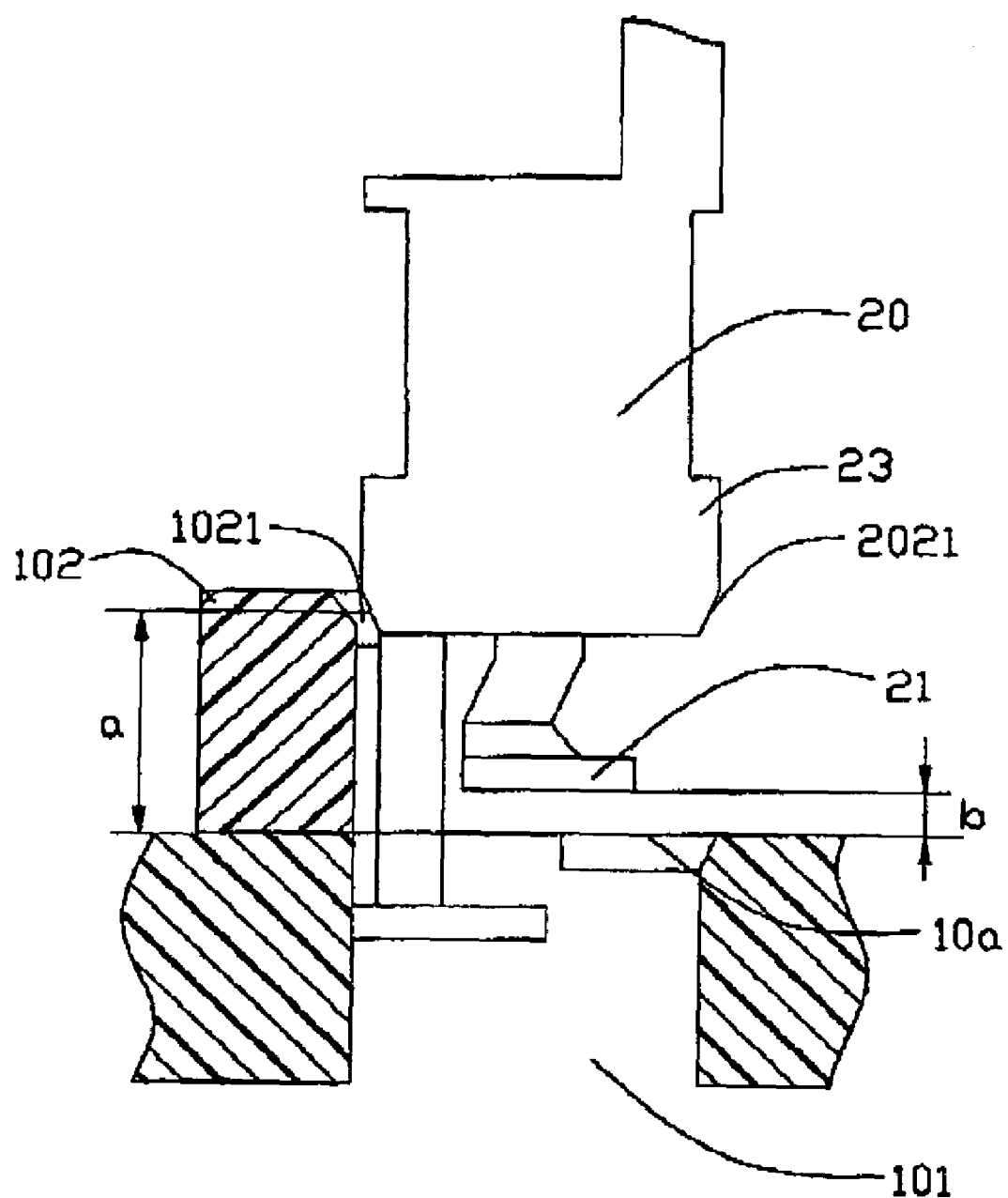
FIG. 2 is a plan view of part of an electrical connector housing of FIG. 1, with a terminal ready to be inserted into the electrical connector housing.
Figure 3:
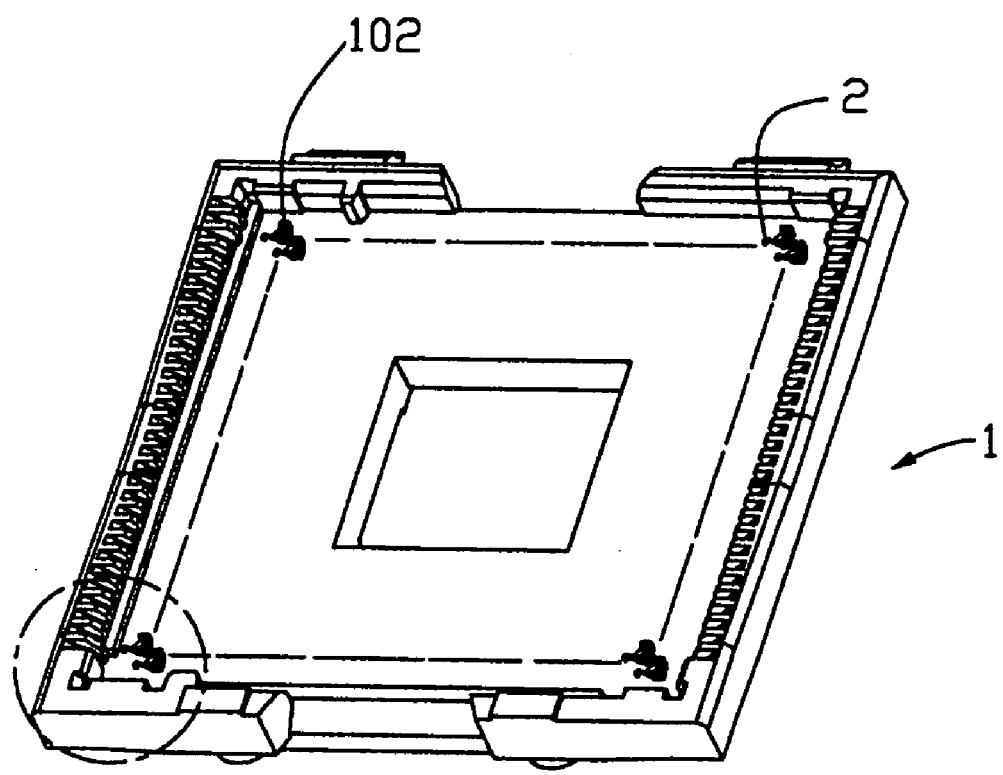
FIG. 3 is an assembled, isometric view of the electrical connector housing of FIG. 1, with a plurality of terminals received in the electrical connector housing.
Figure 4:
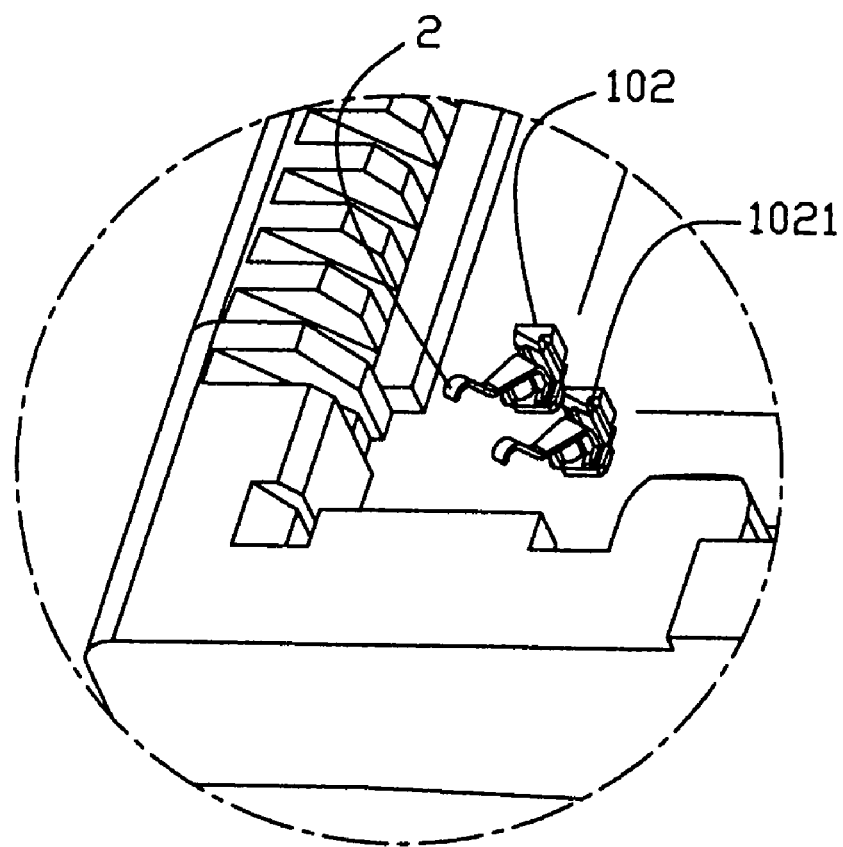
FIG. 4 is an enlarged, isometric view of part of the electrical connector housing of FIG. 3.

As shown in FIG. 2, the terminal 2 mates with the blocking wall 102 by the lead-in surface 2021 of the terminal 2 engages against the lead-in surface 1021 of the blocking wall 102. And the blocking wall 102 has a predetermined height, from the passageway 101, such that the terminal 2 and the blocking wall 102 begins to mate at a location A that lower contact engaging portion 21 does not enter the passageway 101, that is, the contact engaging portion 21 extends beyond the top surface 10a of the passageway 101. In other words, a distance "a" from such an original mating location to the top surface 11a of the passageway 101 is larger than a distance "b" between the lower contact engaging portion 21 to the same top surface 10a.

The provision of the blocking wall 102 with a predetermined height thereof has the advantage that, the terminal 2 begins to mate with the blocking wall 102 before the contact engaging portion 21 of the terminal 2 does enter the passageway 101. Accordingly, no crash between the contact engaging portion 21 and the passageway 101 will occur, in that once the terminal 2 happens to mate with the blocking wall 102, the terminal 2 is guiding by the blocking wall 102 to be inserted along a predetermined path of the passageway 101, there is no possibility of the contact engaging portion 21 in contact with the passageway 101 including the top surface 10a thereof.

Figure 5:
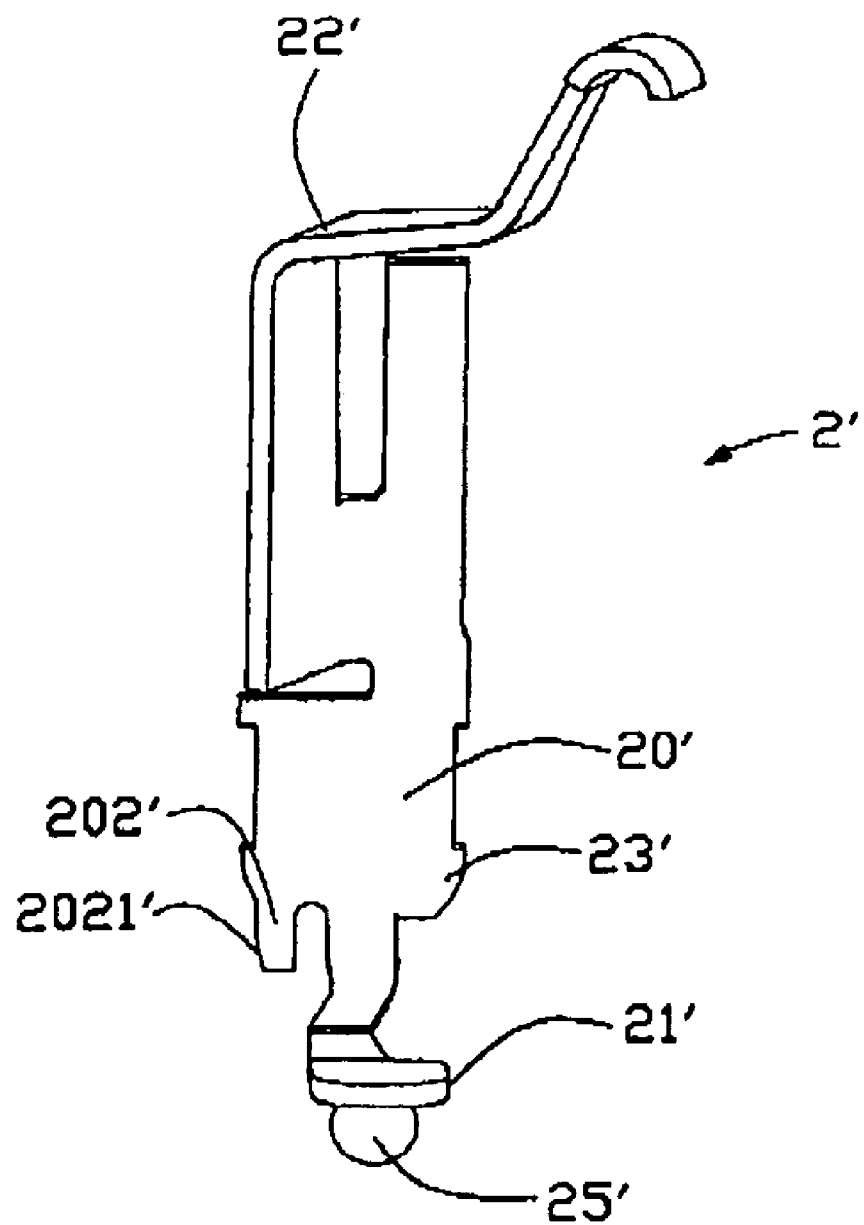
FIG. 5 is an isometric view of a terminal of an electrical connector according to a second preferred embodiment of the present invention.
Figure 6:
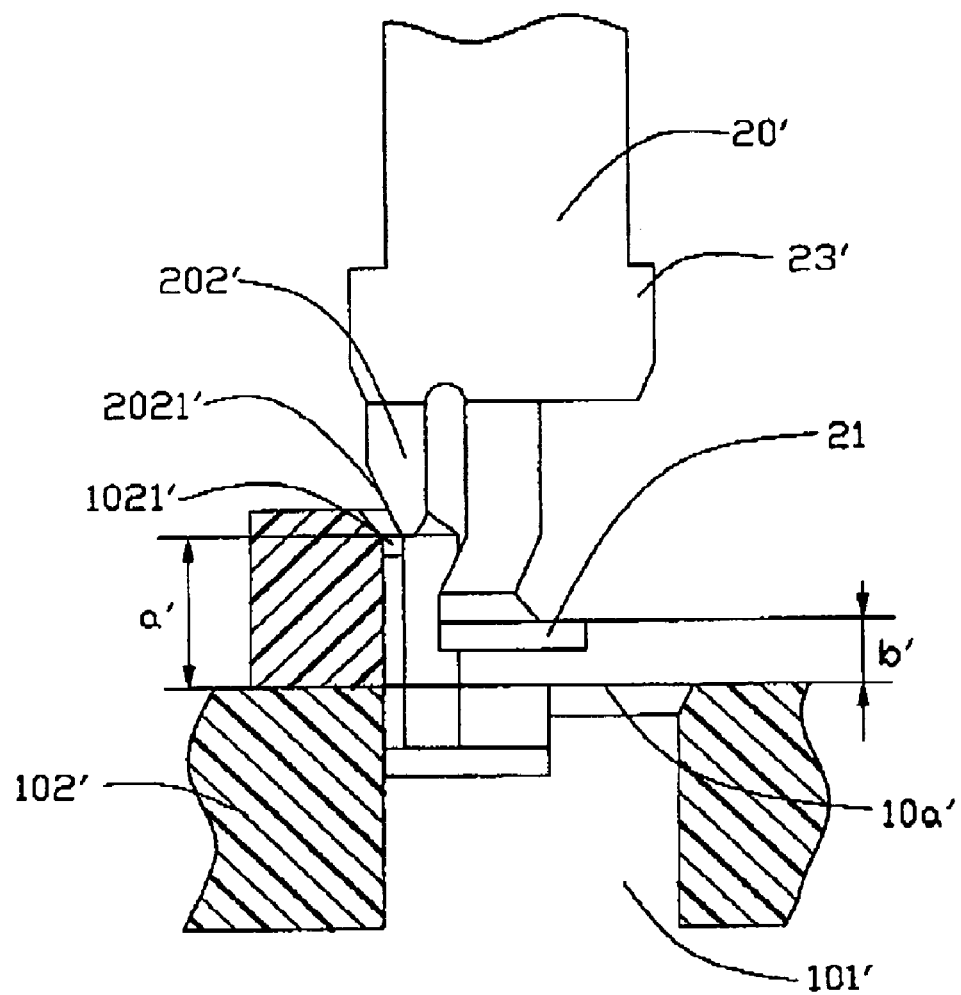
FIG. 6 is a plan view of part of an electrical connector housing with the terminal of FIG. 5 ready to be inserted into the electrical connector housing.

Referring to FIGS. 5 to 6, according to the second embodiment, the terminal 2' includes a post-like extending portion 202' extending downwardly from one side of a main body 20', and a guiding means or engagement section defined on the post-like extending portion 202' to be located below a retention portion 23'. The extending portion 202' and the blocking wall 102' have matching lead-in surfaces 2021', 1021' disposed adjacent one side of the terminal 2' and the lower contact engaging portion 21' having a solder ball 25' attached thereon, wherein the lead-in surfaces 2021', 1021' function as the guiding means or engagement sections.

As shown in FIG. 6, the terminal 2' mates with the blocking wall 102' by the lead-in surface 2021' of the post-like extending portion 202' that engages against the lead-in surface 1021' of the blocking wall 102'. And the extending portion 202' has a predetermined height thereof such that the terminal 2' and the blocking wall 102' begins to mate at a location that lower contact engaging portion 21' does not enter the passageway 101', that is, the contact engaging portion 21' extends beyond the top surface 10a' of the passageway 101'. In other words, a distance "a"' from such an original mating location to the top surface 10a' of the passageway 101' is larger than a distance "b"' between the lower contact engaging portion 21' to the same top surface 10a'.

The provision of the extending portion 202' with a predetermined height thereof has the advantage that, the extending portion 202' of the terminal 2' begins to mate with the blocking wall 102' before the contact engaging portion 21' of the terminal 2' does enter the passageway 101'. Accordingly, no crash between the contact engaging portion 21' and the passageway 101' will occur, in that once the terminal 2' happens to mate with the blocking wall 102', the terminal 2' is guiding by the blocking wall 102' to be inserted along a predetermined path of the passageway 101', there is no possibility of the contact engaging portion 21' in contact with the passageway 101' including the top surface 10a thereof.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. An electrical connector for electrical connection with an LGA package and a printed circuit board, comprising:
    an insulative housing having a general flat base with a top mating interface adapted to face the LGA package, and a mounting interface adapted to face the printed circuit board;
    a plurality of passageways extending from the top mating interface toward the mounting interface;
    a plurality of terminals inserted into the passageways from the mating interface to the mounting interface respectively, each of the terminals including a main body, upper and lower contact engaging portions extending upwardly and downwardly from the main body respectively; and
    a plurality of blocking walls formed on the housing and located essentially above the adjacent corresponding passageways, respectively;
    guiding means formed on each of said terminals and adjacent the corresponding lower contact engaging portion;
    wherein, during the insertion of the terminal into the passageway, said guiding means of the terminal and the corresponding blocking wall begin to mate at a mating location that said lower contact engaging portion does not enter the passageway.

2. The electrical connector as recited in claim 1, wherein the blocking wall has a predetermined height from the passageway such that a distance from said mating location to a top surface of the passageway is larger than a distance between said lower contact engaging portion and said top surface of the passageway.

3. The electrical connector as recited in claim 2, wherein the blocking wall and the terminal have matching first lead-in surfaces adjacent one side of the terminal and said lower contact engaging portion.

4. The electrical connector as recited in claim 3, wherein the terminal includes a second lead-in surface along an opposite side of the terminal.

5. The electrical connector as recited in claim 1, wherein said terminal includes a downward extending portion formed on one side of the main body, said guiding means defined on the downward extending portion, the extending portion having a predetermined height from the passageway such that a distance from said mating location to a top surface of the passageway is larger than a distance between said lower contact engaging portion to said top surface of the passageway.

6. The electrical connector as recited in claim 5, wherein the downward extending portion and the blocking wall have matched lead-in surfaces adjacent one side of the terminal and said lower contact engaging portion.

7. The electrical connector as recited in claim 1, wherein the upper contact engaging portion extends from the passageway and beyond the mating surface after the terminal has been fully inserted into the passageway.

8. The electrical connector as recited in claim 7, wherein the lower contact engaging portion has a solder ball attached thereon.

9. The electrical connector as recited in claim 1, further comprising a reinforcing member disposed around the base, the reinforcing member further comprising a lever and a clip to jointly press the LGA package onto the base so as to make electrically connection between the LGA package and the socket.

10. An electrical connector comprising:
an insulative housing defining a base;
a plurality of passageways formed in the base;
a plurality of blocking walls formed on the housing and located essentially above the adjacent corresponding passageways, respectively; and
a plurality of terminals downwardly inserted into the corresponding passageways with upper contacting portions extending above the base after assembled, wherein
each of said terminals defines an engagement section which is engageably guided by the corresponding blocking wall before said terminal enters the corresponding passageway.

11. The electrical connector as claimed in claim 10, wherein said terminal defines a mounting tip spaced from the engagement section with a first distance, and the blocking wall defining an upper tip spaced from a top face of the corresponding passageway with a second distance larger than the first distance so as to assure engageable guidance between the terminal and the blocking wall occurs before the mounting rip of the terminal enters the passageway.

12. The electrical connector as claimed in claim 11, wherein the base defines said top face from which the block walls extend upwardly and the passageways extend downwardly.

13. The electrical connector as claimed in claim 11, wherein the passageway surrounds the corresponding terminal while the block wall only supports the corresponding terminal by one side of said terminal.

14. The electrical connector as claimed in claim 11, wherein said engagement portion has a downward extension, is laterally spaced from a downward branch of the terminal under a condition that said mounting tip is located at a bottom end of said branch.

15. The electrical connector as claimed in claim 11, wherein the engagement portion is located below a barbed retention section of the terminal.

16. An electrical connector comprising:
an insulative housing defining a base;
a plurality of passageways fanned in the base; and
a plurality of terminals each having an upper contacting portion extending above the base and a lower mounting tip below the base after assembly, a retention portion of each of said terminals being located between the upper contact portion and the lower mounting tip; wherein
each of said terminals defines an engagement section which is located below the retention portion and engageably guided by the housing before the lower mounting tip enters the corresponding passageway when the terminal is downwardly inserted into the corresponding passageway.

17. The electrical connector as claimed in claim 16, wherein said engagement portion having an downward extension, is laterally spaced from a downward branch of the terminal under a condition that said mounting tip is located at a bottom end of said branch.

* * * * *